United States Patent
Lee (10) Patent No.: US 9,818,897 B2
(45) Date of Patent: Nov. 14, 2017

(54) DEVICE FOR GENERATING SOLAR POWER AND METHOD FOR MANUFACTURING SAME

(75) Inventor: Jin Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 827 days.

(21) Appl. No.: 13/639,704

(22) PCT Filed: Apr. 27, 2011

(86) PCT No.: PCT/KR2011/003120
§ 371 (c)(1),
(2), (4) Date: Oct. 5, 2012

(87) PCT Pub. No.: WO2012/033274
PCT Pub. Date: Mar. 15, 2012

(65) Prior Publication Data
US 2013/0037099 A1    Feb. 14, 2013

(30) Foreign Application Priority Data

Sep. 10, 2010   (KR) ................. 10-2010-0089133

(51) Int. Cl.
| H01L 31/0352 | (2006.01) |
| H01L 31/0392 | (2006.01) |
| H01L 31/0465 | (2014.01) |

(52) U.S. Cl.
CPC .. *H01L 31/03928* (2013.01); *H01L 31/03923* (2013.01); *H01L 31/0465* (2014.12); *Y02E 10/541* (2013.01); *Y02P 70/521* (2015.11)

(58) Field of Classification Search
CPC ... H01L 31/00; H01L 31/02; H01L 31/02008; H01L 31/0248; H01L 31/0352;
(Continued)

(56) References Cited

U.S. PATENT DOCUMENTS 5,538,902 A * 7/1996 Izu ................. H01L 31/0352
136/244
6,455,347 B1 * 9/2002 Hiraishi ............. H01L 31/202
136/244
(Continued)

FOREIGN PATENT DOCUMENTS

JP    2008-140920 A    6/2008
JP    2010177463 A  *  8/2010 ........... H01L 31/04
(Continued)

OTHER PUBLICATIONS

English machine translation of Suehiro et al. (JP 2010-177463) published on Aug. 12, 2010.*
(Continued)

*Primary Examiner* — Christina Chern
(74) *Attorney, Agent, or Firm* — Saliwanchik, Lloyd & Eisenschenk (57) ABSTRACT

Disclosed are a solar cell apparatus and a method of fabricating the same. The A solar cell apparatus includes a substrate; a back electrode layer on the substrate; a light absorbing layer on the back electrode layer; and a window layer on the light absorbing layer, wherein the light absorbing layer is formed with a third through hole having a first width, and the window layer is formed with a fourth through hole having a second width larger than the first width, and the fourth through hole corresponds to the third through hole.

12 Claims, 6 Drawing Sheets

(58) Field of Classification Search
CPC ............. H01L 31/035281; H01L 31/04; H01L 31/0475; H01L 31/0322; H01L 31/035272; H01L 31/0392; H01L 31/03923; H01L 31/042; H01L 31/0445; H01L 31/046; H01L 31/0463
See application file for complete search history.

(56) References Cited

U.S. PATENT DOCUMENTS

| | | | |
|---|---|---|---|
| 2005/0056312 A1* | 3/2005 | Young | H01L 31/0749 136/258 |
| 2007/0193622 A1 | 8/2007 | Sai | |
| 2007/0209700 A1* | 9/2007 | Yonezawa et al. | 136/265 |
| 2008/0110491 A1* | 5/2008 | Buller | H01L 31/03528 136/249 |
| 2009/0084425 A1* | 4/2009 | Milshtein et al. | 136/244 |
| 2010/0065115 A1 | 3/2010 | Yata | |

FOREIGN PATENT DOCUMENTS

| | | |
|---|---|---|
| KR | 10-2007-00047787 A | 1/2007 |
| KR | 10-2010-0112826 A | 10/2010 |
| KR | 10-2011-0001808 A | 1/2011 |
| WO | WO-2009/150654 A2 | 12/2009 |
| WO | WO 2010044738 A1 * 4/2010 ............. Y02E 10/50 |

OTHER PUBLICATIONS

Notice of Allowance dated Feb. 13, 2013 in Korean Application No. 10-2010-0089133, filed Sep. 10, 2010.

International Search Report in International Application No. PCT/KR2011/003120, filed Apr. 27, 2011.

Office Action dated Nov. 28, 2011 in Korean Application No. 10-2010-0089133, filed Sep. 10, 2010.

* cited by examiner

DEVICE FOR GENERATING SOLAR POWER AND METHOD FOR MANUFACTURING SAME

CROSS-REFERENCE TO RELATED APPLICATIONS

This application is the U.S. national stage application of International Patent Application No. PCT/KR2011/003120, filed Apr. 27, 2011, which claims priority to Korean Application No. 10-2010-0089133, filed Sep. 10, 2010, the disclosures of each of which are incorporated herein by reference in their entirety.

TECHNICAL FIELD

The embodiment relates to a solar cell apparatus and a method of fabricating the same.

BACKGROUND ART

Recently, as energy consumption is increased, a solar cell has been developed to convert solar energy into electric energy.

In particular, a CIGS-based solar cell apparatus, which is a PN hetero junction apparatus having a substrate structure including a glass substrate, a metallic back electrode layer, a P type CIGS-based light absorbing layer, a high-resistance buffer layer, and an N type window layer, has been extensively used.

In addition, a patterning process for dividing a solar cell into a plurality of cells must be performed to fabricate the solar cell apparatus.

DISCLOSURE

Technical Problem

The embodiment provides a solar cell apparatus capable of preventing the short and improving the photoelectric conversion efficiency and a method of fabricating the same.

Technical Solution

A solar cell apparatus according to the embodiment includes a substrate; a back electrode layer on the substrate; a light absorbing layer on the back electrode layer; and a window layer on the light absorbing layer, wherein the light absorbing layer is formed with a third through hole having a first width, and the window layer is formed with a fourth through hole having a second width larger than the first width, and the fourth through hole corresponds to the third through hole.

A solar cell apparatus according to the embodiment includes a back electrode; a light absorbing part on the back electrode; and a window formed on the light absorbing part such that a step different is formed between the window and the light absorbing part.

A method of fabricating a solar cell apparatus according to the embodiment includes the steps of forming a back electrode layer on the substrate; forming a light absorbing layer on the back electrode layer; forming a window layer on the light absorbing layer; forming a mask pattern on the window layer; and forming a third through hole having a first width in the light absorbing layer and forming a fourth through hole having a second width larger than the first width in the window layer by etching the window layer and the light absorbing layer.

Advantageous Effects

The solar cell apparatus according to the embodiment includes the third and fourth through holes. At this time, the fourth through holes have a relatively large width and the third through holes have a relatively small width.

In addition, the fourth through holes divide the window layer having relatively low resistance and the third through holes divide the light absorbing layer having relatively high resistance.

Thus, the third and fourth through holes can effectively divide the light absorbing layer and the window layer, respectively. In particular, the third and fourth through holes can divide each cell, so that the short between the cells can be effectively prevented.

Therefore, the solar cell apparatus according to the embodiment can prevent the short between the cells and improve the photoelectric conversion efficiency.

BEST MODE

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 1:
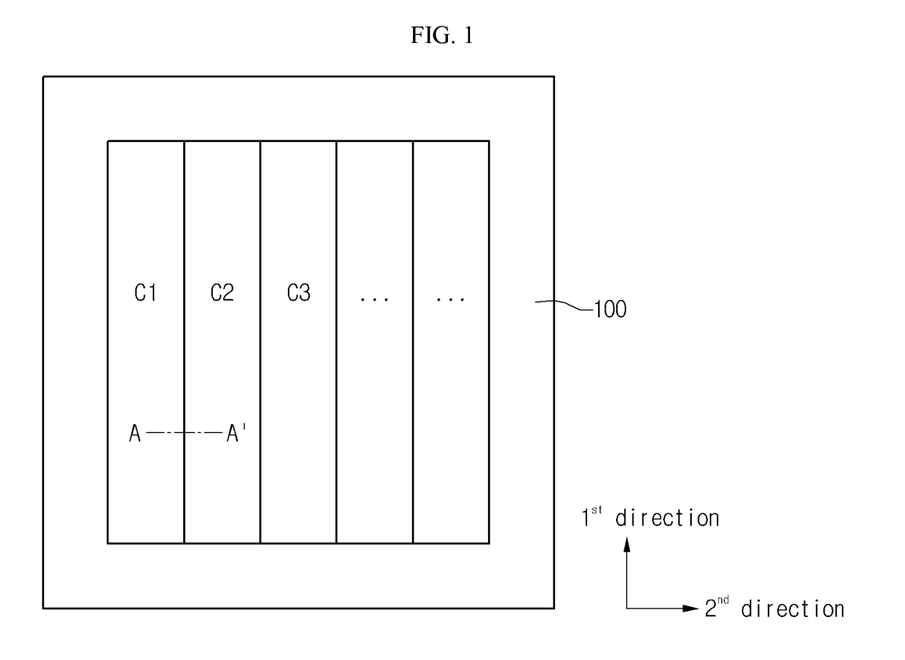
FIG. 1 is a plan view showing a solar cell panel according to the embodiment.
Figure 2:
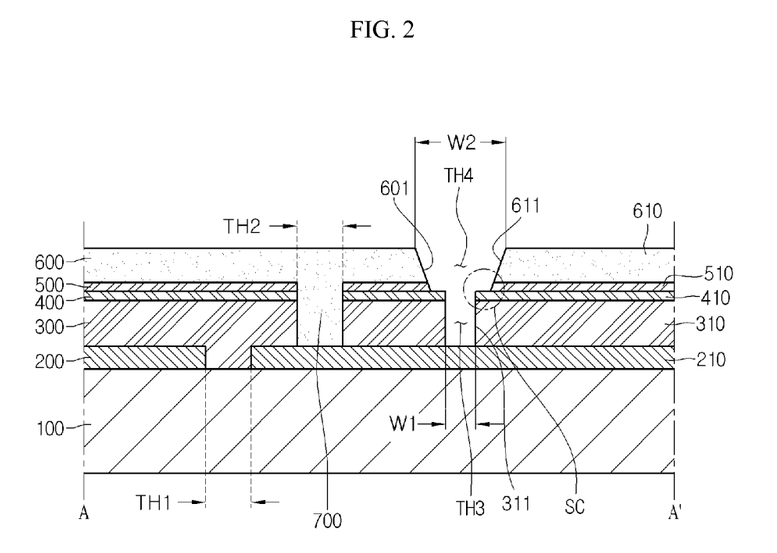
FIG. 2 is a sectional view taken along line A-A' of FIG. 1.

FIG. 1 is a plan view showing a solar cell panel according to the embodiment, and FIG. 2 is a sectional view taken along line A-A' of FIG. 1.

Referring to FIGS. 1 and 2, the solar cell panel according to the embodiment includes a support substrate 100, a back electrode layer 200, a light absorbing layer 300, a buffer layer 400, a high-resistance buffer layer 500, a window layer 600 and a plurality of connection parts 700.

The support substrate 10 has a plate shape and supports the back electrode layer 200, the light absorbing layer 300, the buffer layer 400, the high-resistance layer 500, the window layer 600 and the connection parts 700.

The support substrate 100 may be an insulator. The support substrate 100 may be a glass substrate, a plastic substrate or a metallic substrate. In detail, the support substrate 100 may be a soda lime glass substrate. The support substrate 100 may be transparent. The support substrate 100 may be flexible or rigid.

The back electrode layer 200 is provided on the support substrate 100. The back electrode layer 200 is a conductive layer. For instance, the back electrode layer 200 may include a metal, such as molybdenum (Mo).

In addition, the back electrode layer 200 may include at least two layers. In this case, the layers may be formed by using the same metal or different metals.

First through holes TH1 are formed in the back electrode layer 200. The first through holes TH1 serve as an open region to expose the top surface of the support substrate 100. When viewed from the top, the first through holes TH1 extend in the first direction.

The first through holes TH1 may have a width in the range of about 80 μm to about 200 μm.

The back electrode layer 200 is divided into a plurality of back electrodes by the first through holes TH1. That is, the back electrodes are defined by the first through TH1.

The back electrodes are spaced apart from each other by the first through holes TH1. The back electrodes are arranged in the form of a stripe.

In addition, the back electrodes can be arranged in the form of a matrix. When viewed from the top, the first through holes TH1 can be arranged in the form of a lattice.

The light absorbing layer 300 is disposed on the back electrode layer 200. In addition, materials included in the light absorbing layer 300 are filled in the first through holes TH1.

The light absorbing layer 300 may include group I-III-VI compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 has an energy bandgap in the range of about 1 eV to about 1.8 eV.

The buffer layer 400 is disposed on the light absorbing layer 300. The buffer layer 400 may include CdS and have an energy bandgap in the range of about 2.2 eV to 2.4 eV.

The high-resistance buffer layer 500 is disposed on the buffer layer 400. The high-resistance buffer layer 500 may include i-ZnO, which is not doped with impurities. The high-resistance buffer layer 500 may have an energy bandgap in the range of about 3.1 eV to about 3.3 eV.

Second through holes TH2 are formed in the light absorbing layer 300, the buffer layer 400 and the high-resistance buffer layer 500. The second through holes TH2 are formed through the light absorbing layer 300. The second through holes TH2 serve as an open region to expose the top surface of the back electrode layer 200.

The second through holes TH2 are adjacent to the first through holes TH1. That is, when viewed from the top, a part of the second through holes TH2 is located besides the first through holes TH1. The second through holes TH2 extend in the first direction.

The second through holes TH2 may have a width in the range of about 80 μm to about 200 μm.

Third through holes TH3 are formed in the light absorbing layer 300, and the buffer layer 400. The third through holes TH3 are formed through the light absorbing layer 300 and the buffer layer 400. The third through holes TH3 serve as an open region to expose the top surface of the back electrode layer 200.

The third through holes TH3 are adjacent to the second through holes TH2, respectively. That is, the second through holes TH2 are interposed between the first through holes TH1 and the third through holes TH3, respectively.

The third through holes TH3 extend in the first direction. The third through holes TH3 may have a width in the range of about 30 μm to about 100 μm. Inner surfaces of the third through holes TH3 may be inclined or perpendicular to the top surface of the light absorbing layer 300.

In addition, a plurality of light absorbing parts may be defined in the light absorbing layer 300 by the second and third through holes TH2 and TH3. That is, the light absorbing layer 300 is divided into the light absorbing parts by the second and third through holes TH2 and TH3.

A plurality of buffers may be defined in the buffer layer 400 by the second and third through holes TH2 and TH3. That is, the buffer layer 400 is divided into the buffers by the second and third through holes TH2 and TH3.

The window layer 600 is formed on the high-resistance buffer layer 500. The window layer 600 is a transparent conductive layer. In addition, the window layer 600 has resistance higher than that of the back electrode layer 200.

The window layer 600 may include oxide. For instance, the window layer 600 may include Al-doped zinc oxide (AZO) or Ga-doped zinc oxide (GZO).

Fourth through holes TH4 are formed in the high-resistance buffer layer 500 and the window layer 600. The fourth through holes TH4 are formed through the high-resistance buffer layer 500 and the window layer 600.

The fourth through holes TH4 are adjacent to the second through holes TH2, respectively. In detail, the fourth through holes TH4 are disposed next to the second through holes TH2, respectively. When viewed from the top, the fourth through holes TH4 are disposed next to the second through holes TH2 in parallel to the second through holes TH2, respectively. The fourth through holes TH4 extend in the first direction.

The fourth through holes TH4 may correspond to the third through holes TH3, respectively. In detail, the fourth through holes TH4 are connected to the third through holes TH3, respectively. In more detail, when viewed from the top, the fourth through holes TH4 may overlap with the third through holes TH3, respectively.

The fourth through holes TH4 may have a width W4 larger than that of the third through holes TH3. For instance, the fourth through holes TH4 may have the width W4 in the range of about 80 μm to about 120 μm.

The inner surfaces 601 of the fourth through holes TH4 may be inclined with respect to the top surface of the window layer 600. The inner surfaces 601 of the fourth through holes TH4 may be inclined at an angle of about 0° to about 30° with respect to the plane perpendicular to the top surface of the window layer 600.

A plurality of high-resistance buffers may be defined in the high-resistance buffer layer 500 by the second and fourth through holes TH2 and TH4. That is, the high-resistance buffer layer 500 is divided into the high-resistance buffers by the second and fourth through holes TH2 and TH4.

The window layer 600 is divided into a plurality of windows by the fourth through hole TH4. That is, the windows are defined by the fourth through hole TH4.

The windows may have shape corresponding to the shape of the back electrodes. That is, the windows are arranged in the form of a stripe. In addition, the windows can be arranged in the form of a matrix.

In addition, a plurality of cells C1, C2 . . . and Cn are defined by the third and fourth through holes TH3 and TH4. In detail, the cells C1, C2 . . . and Cn are defined by the second, third and fourth through holes TH2, TH3 and TH4. That is, the solar cell apparatus according to the embodiment may be divided into the cells C1, C2 . . . and Cn by the second, third and fourth through holes TH2, TH3 and TH4. The cells C1, C2 . . . and Cn are connected with each other in the second direction crossing the first direction. That is, current may flow in the second direction through the cells C1, C2 . . . and Cn.

Each of the cells C1, C2 . . . and Cn may include the back electrode, the light absorbing part, the buffer, the high-resistance buffer and the window. In particular, each of the cells C1, C2 . . . and Cn may have a stack structure of the back electrode, the light absorbing part, the buffer, the high-resistance buffer and the window. At this time, a step difference is formed between the window and the light absorbing part.

For instance, as shown in FIG. 2, the second cell C2 may include the back electrode 210, the light absorbing part 310, the buffer 410, the high-resistance buffer 510 and the window 610.

The window 610 is formed on the light absorbing part 310. In addition, a step difference is formed between the window 610 and the light absorbing part 310. A lateral side 311 of the light absorbing part 310 protrudes in the lateral direction more than the lateral side 611 of the window 610. That is, the lateral side 311 of the light absorbing part 310 may be disposed in the plane different from the plane of the lateral side 611 of the window 610. At this time, the lateral side 611 of the window 610 may be inclined with respect to the top surface of the back electrode layer 200.

The lateral side 311 of the light absorbing part 310 may be an inner surface of the third through hole TH3. In addition, the lateral side 611 of the window 610 may be an inner surface of the fourth through hole TH4.

Further, a step difference may be formed between the high-resistance buffer 510 and the buffer 410. The buffer 410 may have a planar shape corresponding to the light absorbing part 310. In addition, one outer peripheral portion of the high-resistance buffer 510 may match with one outer peripheral portion of the window 610.

The connection parts 700 are disposed in the second through holes TH2. The connection parts 700 extend downward from the window layer 600 and are connected to the back electrode layer 200. For instance, the connection parts 700 extend from the window of the first cell C1 and are connected to the back electrode of the second cell C2.

Thus, the connection parts 700 connect adjacent cells with each other. In detail, the connection parts 700 connect windows with the back electrodes included in adjacent cells C1, C2 . . . and Cn.

The connection parts 700 are integrally formed with the window layer 600. That is, the material used to form the connection parts 700 may be equal to the material used to form the window layer 600.

The solar cell panel according to the embodiment includes the third through holes TH3 having the relatively small width W1 and the fourth through holes TH4 having the relatively large width W2. In this case, the fourth through holes TH4 divide the window layer 600 having the relatively low resistance and the third through holes TH3 divide the light absorbing layer 300 having the relatively high resistance.

Therefore, the third and fourth through holes TH3 and TH4 can effectively divide the light absorbing layer 300 and the window layer 600, respectively. In particular, the third and fourth through holes TH3 and TH4 can divide the cells C1, C2 . . . and Cn such that the short between adjacent cells can be effectively prevented.

In addition, the step difference SC is formed between the light absorbing layer 300 and the window layer 600. That is, the window layer 600 is laminated on the light absorbing layer 300 in the form of a stair. Due to the step difference SC, external impurities can be prevented from penetrating into the third through holes TH3. That is, the external impurities are blocked by the step difference SC.

Thus, the solar cell panel according to the embodiment can prevent the short between adjacent cells C1, C2 . . . and Cn and can improve the photoelectric efficiency.

In addition, since the third through hole TH3 has the small width W1, the back electrode 200 may be less exposed. Further, the solar cell panel according to the embodiment can effectively protect a portion of the light absorbing layer 300, which corresponds to an active layer where the solar light is converted into the electric energy.

That is, since the third through holes TH3 divide the light absorbing layer 300 having the high resistance, the portion of the light absorbing layer 300 disposed in the active layer with the small width W1 and the back electrode layer 200 can be effectively protected.

Thus, the solar cell apparatus according to the embodiment may have the improved durability and reliability.

FIGS. 3 to 10 are sectional views showing the method of fabricating the solar cell apparatus according to the embodiment. The description about the method of fabricating the solar cell according to the embodiment will be made with reference to the above description about the solar cell apparatus. The above description about the solar cell apparatus will be basically incorporated in the description about the method of fabricating the solar cell.

Figure 3:
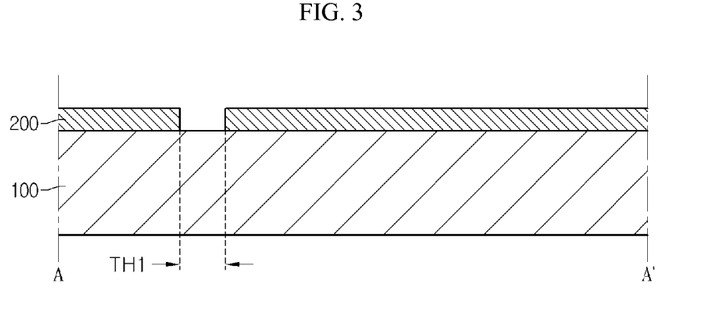
FIGS. 3 to 10 are sectional views showing a method of fabricating a solar cell panel according to the embodiment.

Referring to FIG. 3, the back electrode layer 200 is formed on the support substrate 100. The back electrode layer 200 is patterned to form the first through holes TH1. Thus, a plurality of back electrodes are formed on the support substrate 100. The back electrode layer 200 is patterned by a laser.

The back electrode layer 200 may include Mo and may have at least two layers formed based on process conditions different from each other.

The first through holes TH1 expose the top surface of the support substrate 100 and have a width in the range of about 80 μm to about 200 μm.

In addition, an additional layer, such as a diffusion barrier layer, may be interposed between the support substrate 100 and the back electrode layer 200. At this time, the first through holes TH1 expose the top surface of the additional layer.

Figure 4:
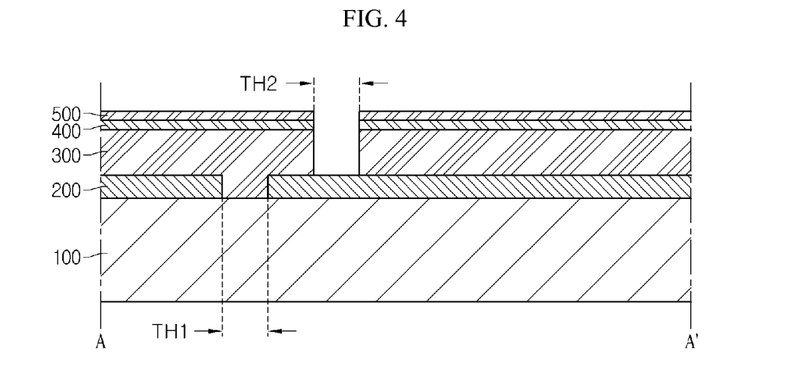

Referring to FIG. 4, the light absorbing layer 300, the buffer layer 400 and the high-resistance buffer layer 500 are formed on the back electrode layer 200.

The light absorbing layer 300 can be formed through the sputtering scheme or the evaporation scheme.

For instance, the light absorbing layer 300 may be formed through various schemes such as a scheme of forming a Cu(In,Ga)Se$_2$ (CIGS) based light absorbing layer 300 by simultaneously or separately evaporating Cu, In, Ga, and Se and a scheme of performing a selenization process after a metallic precursor layer has been formed Regarding the details of the selenization process after the formation of the metallic precursor layer, the metallic precursor layer is formed on the back electrode layer 200 through a sputtering process employing a Cu target, an In target, or a Ga target.

Thereafter, the metallic precursor layer is subject to the selenization process so that the Cu (In, Ga) Se$_2$ (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Then, CdS is deposited through the sputtering process or the chemical bath deposition (CBD) process to form the buffer layer 400.

After that, ZnO is deposited on the buffer layer 400 through the sputtering process to form the high-resistance buffer layer 500.

The buffer layer 400 and the high-resistance buffer layer 500 may have the shallow thickness. For instance, the buffer layer 400 and the high-resistance buffer layer 500 may have the thickness in the range of about 1 nm to about 80 nm.

Then, the light absorbing layer 300, the buffer layer 400 and the high-resistance buffer layer 500 are partially removed to form the second through holes TH2.

The second through holes TH2 can be formed by a mechanical device, such as a tip, or a laser device.

For instance, the light absorbing layer 300 and the buffer layer 400 may be patterned by using the tip having a width in the range of about 40 μm to about 180 μm.

The second through hole TH2 may have the width in the range of about 100 μm to about 200 μm. In addition, the second through hole TH2 may expose a part of the top surface of the back electrode layer 200.

Figure 5:
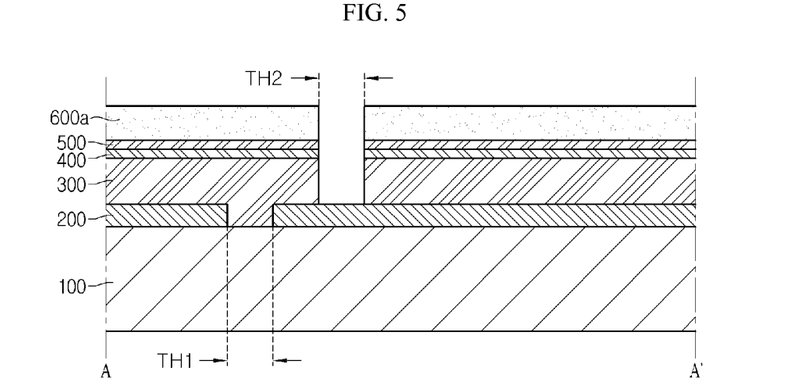

Referring to FIG. 5, a transparent conductive layer 600a is formed on the light absorbing layer 300 and in the second through holes TH2. That is, the transparent conductive layer 600a can be formed by depositing transparent conductive materials on the high-resistance buffer layer 500 and in the second through holes TH2.

For instance, the transparent conductive layer 600a can be formed by depositing Al-doped zinc oxide (AZO) on the top surface of the high-resistance buffer layer and in the second through holes TH2 through the sputtering process.

At this time, the transparent conductive material is filled in the second through holes TH2 and the transparent conductive layer 600a directly makes contact with the back electrode layer 200.

Figure 6:
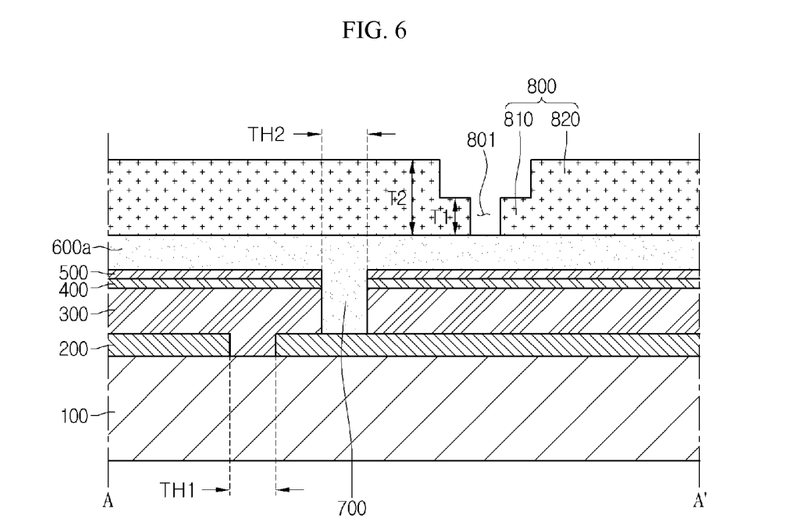

Referring to FIG. 6, a mask pattern 800 is formed on the transparent conductive layer 600a. The mask pattern 800 may include exposure holes 801 to expose the top surface of the transparent conductive layer 600a. The exposure holes 801 are adjacent to the second through holes TH2, respectively. The exposure holes 801 extend in the first direction.

The mask pattern 800 includes a first mask part 810 and a second mask part 820.

The first mask part 810 is adjacent to the exposure holes 801. That is, the exposure holes 801 are formed through the first mask part 810.

The first mask part 810 has a thickness T1 thinner than a thickness of the second mask part 820. In detail, the first mask part 810 may have the thickness T1 in the range of about 20 μm to about 40 μm.

The second mask part 820 has a thickness T2 thicker than the thickness T1 of the first mask part 810. In detail, the second mask part 820 may have the thickness T2 in the range of about 50 μm to about 90 μm.

For instance, a material used to form the mask pattern 800 may include a photoresist film.

Figure 7:
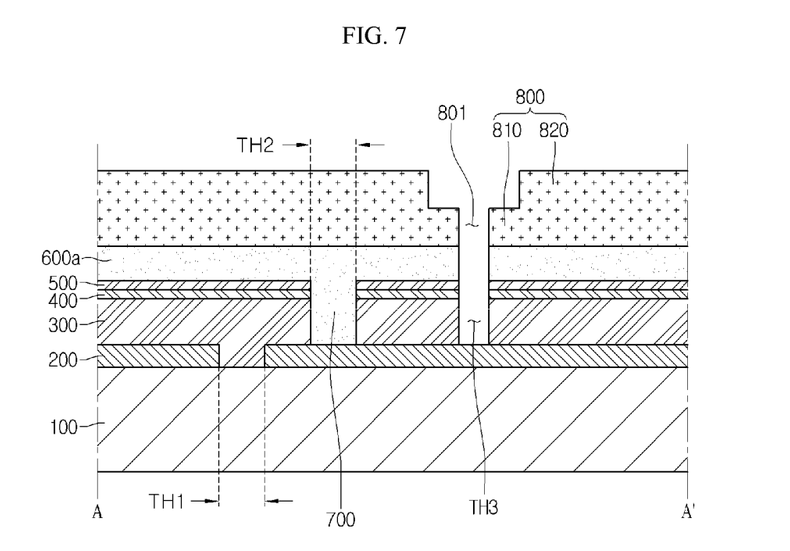

Referring to FIG. 7, the light absorbing layer 300, the buffer layer 400, the high-resistance buffer layer 500, and the transparent conductive layer are etched by using the mask pattern 800 as an etching mask. Thus, a plurality of third through holes TH3 are formed in the light absorbing layer 300 and the buffer layer 400.

The third through holes TH3 may correspond to the exposure holes 801, respectively. In detail, the third through holes TH3 match with the exposure holes 801, respectively.

A wet etching process or a dry etching process may be performed to form the third through holes TH3.

Various etching solutions can be used to form the third through holes TH3 through the wet etching process. In addition, various etching gases can be used to form the third through holes TH3 through the dry etching process.

Figure 8:
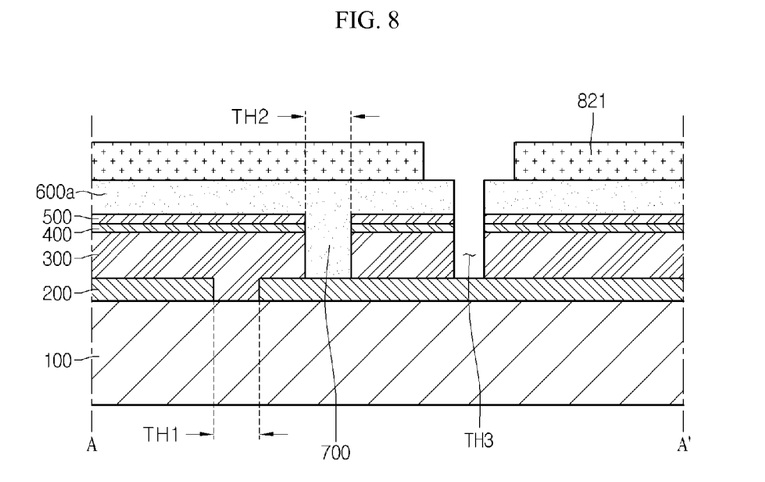

Referring to FIG. 8, after the third through holes TH3 have been formed, the first mask part 810 is removed and the thickness of the second mask part 820 is reduced. At this time, O$_2$ plasma may be sprayed toward the mask pattern 800 in order to remove the first mask part 810.

Therefore, all of the first mask part 810 and a part of the second mask part 820 may be simultaneously removed.

Figure 9:
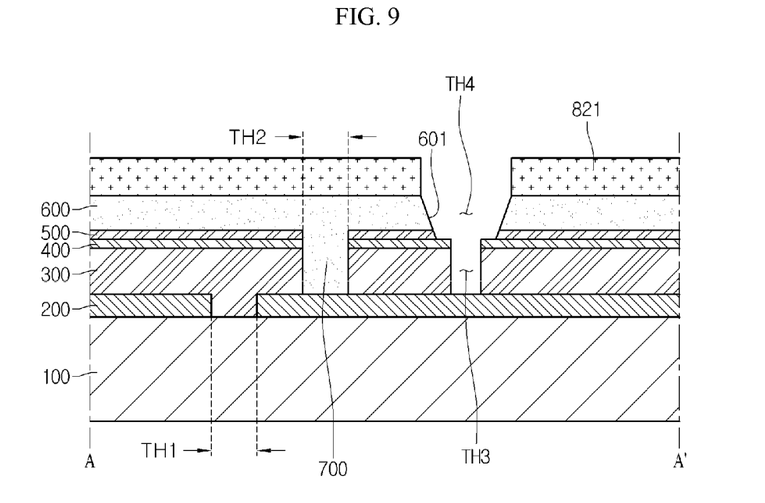

Referring to FIG. 9, the high-resistance buffer layer 500 and the window layer 600 are patterned by using a mask pattern 821 where the first mask part 810 has been removed. Thus, the fourth through holes TH4 are formed in the high-resistance buffer layer 500 and the window layer 600.

The fourth through holes TH4 can be formed by selectively etching the high-resistance buffer layer 500 and the window layer 600 using the etching solution.

The fourth through holes TH4 can be formed corresponding to the region where the first mask part 810 has been removed.

Figure 10:
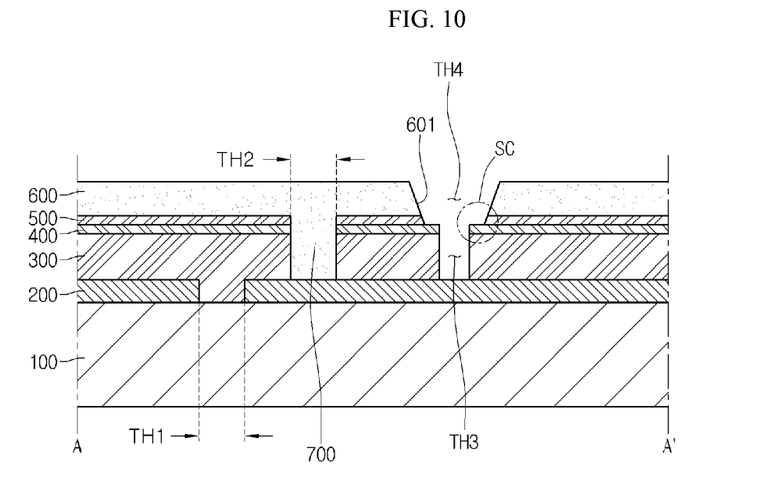

Referring to FIG. 10, the mask pattern 821 is removed, so that the solar cell panel capable of preventing the short and improving the reliability and the durability can be obtained.

The solar cell panel according to the embodiment corresponds to the solar cell apparatus that receives solar light to convert the solar light into the electric energy. Thus, the embodiment may be applied to the solar cell apparatus as well as the solar cell panel.

INDUSTRIAL APPLICABILITY

The solar cell apparatus according to the embodiment can be applied in the field of solar light generation.

The invention claimed is:
1. A solar cell apparatus comprising:
a substrate;
a back electrode layer on the substrate;
a light absorbing layer on the back electrode layer;
a window layer on the light absorbing layer;
a connection part extending downward from the window layer;
a buffer layer between the light absorbing layer and the window layer; and
a high-resistance buffer layer between the buffer layer and the window layer;
wherein the back electrode layer includes molybdenum (Mo),
wherein the high-resistance buffer layer includes i-ZnO which is not doped with impurities,
wherein the window layer includes Al-doped zinc oxide (AZO) or Ga-doped zinc oxide (GZO);
wherein the back electrode layer is formed with a first through hole to expose a top surface of the substrate;
wherein a second through hole penetrates the light absorbing layer, the buffer layer, and the high-resistance buffer layer to expose a top surface of the back electrode layer;
wherein the connection part is disposed in the second through hole;
wherein the light absorbing layer and the buffer layer are formed with a third through hole having a first width, wherein the window layer and the high-resistance buffer layer are formed with a fourth through hole having a second width larger than the first width, wherein the fourth through hole corresponds to the third through hole;

wherein an inner surface of the third through hole is perpendicular to a top surface of the light absorbing layer;

wherein an inner surface of the fourth through hole is inclined with respect to the top surface of the light absorbing layer;

wherein the fourth through hole exposes a part of a top surface of the buffer layer, wherein an inner surface of the fourth through hole is inclined at an angle in a range of 1° to 30° with respect to a plane perpendicular to a top surface of the window layer, wherein the connection part is integrally formed with the window layer, wherein a side surface of the buffer layer and a side surface of the high-resistance buffer layer are not flush with each other and thereby create a first step difference, wherein an exposed surface area of the buffer layer is greater than an exposed surface area of the high-resistance buffer layer formed by the fourth through hole, and wherein one outer peripheral portion of the high-resistance buffer layer is contiguous with one outer peripheral portion of the window layer.

2. The solar cell apparatus of claim 1, wherein a second step difference is formed between the light absorbing layer and the window layer.

3. The solar cell apparatus of claim 1, wherein the first width of the third through hole is in a range of 40 µm to 100 µm, and the second width of the fourth through hole is in a range of 80 µm to 120 µm.

4. The solar cell apparatus of claim 1, wherein the fourth through hole overlaps with the third through hole.

5. The solar cell apparatus of claim 1, wherein another step difference is formed between the inner surface of the third through hole and the inner surface of the fourth through hole.

6. A solar cell apparatus comprising:
a back electrode;
a light absorbing part on the back electrode;
a window formed on the light absorbing part such that a side surface of the window and a side surface of the light absorbing part are not flush with each other and thereby form a first step difference between the window and the light absorbing part;
a connection part extending downward from the window;
a buffer between the light absorbing part and the window;
a high-resistance buffer between the buffer and the window;
a first through hole formed in the back electrode;
a second through hole penetrating the light absorbing part, the buffer, and the high-resistance buffer;
a third through hole formed in the light absorbing part and the buffer; and
a fourth through hole formed in the high-resistance buffer and the window;
wherein the back electrode includes molybdenum (Mo),
wherein the high-resistance buffer includes i-ZnO which is not doped with impurities,
wherein the window includes Al-doped zinc oxide (AZO) or Ga-doped zinc oxide (GZO);
wherein the connection part is disposed in the second through hole;

wherein a lateral side of the window and a lateral side of the high-resistance buffer each is inclined with respect to a top surface of the back electrode, wherein a lateral side of the light absorbing part and a lateral side of the buffer each is perpendicular to the top surface of the back electrode;

wherein the fourth through hole exposes a part of a top surface of the buffer, wherein an inner surface of the fourth through hole is inclined at an angle in a range of 1° to 30° with respect to a plane perpendicular to a top surface of the window, wherein the connection part is integrally formed with the window, wherein a second step difference is formed between the buffer and the high-resistance buffer, wherein an exposed surface area of the buffer is greater than an exposed surface area of the high-resistance buffer formed by the fourth through hole, and wherein one outer peripheral portion of the high-resistance buffer is contiguous with one outer peripheral portion of the window.

7. The solar cell apparatus of claim 6, wherein the lateral side of the light absorbing part protrudes in a lateral direction more than the lateral side of the window protrudes.

8. A method of fabricating a solar cell apparatus, the method comprising:
forming a substrate;
forming a back electrode layer on the substrate;
forming a light absorbing layer on the back electrode layer;
forming a window layer on the light absorbing layer;
forming a connection part extending downward from the window layer;
forming a buffer layer between the light absorbing layer and the window layer;
forming a high-resistance buffer layer between the buffer layer and the window layer; and
forming a mask pattern on the window layer;
wherein the back electrode layer includes molybdenum (Mo),
wherein the high-resistance buffer layer includes i-ZnO which is not doped with impurities,
wherein the window layer includes Al-doped zinc oxide (AZO) or Ga-doped zinc oxide (GZO),
wherein the back electrode layer is formed with a first through hole to expose a top surface of the substrate;
wherein a second through hole penetrates the light absorbing layer, the buffer layer, and the high-resistance buffer layer to expose a top surface of the back electrode layer;
wherein the connection part is disposed in the second through hole,
wherein the light absorbing layer and the buffer layer are formed with a third through hole having a first width,
wherein the window layer and the high-resistance buffer layer are formed with a fourth through hole having a second width larger than the first width,
wherein the fourth through hole corresponds to the third through hole,
wherein an inner surface of the third through hole is perpendicular to a top surface of the light absorbing layer,
wherein an inner surface of the fourth through hole is inclined with respect to the top surface of the light absorbing layer, wherein the fourth through hole exposes a part of a top surface of the buffer layer, wherein an inner surface of the fourth through hole is inclined at an angle in a range of 1° to 30° with respect to a plane perpendicular to a top surface of the window layer, wherein the connection part is integrally formed with the window layer, wherein a side surface of the buffer layer and a side surface of the high-resistance buffer layer are not flush with each other and thereby create a first step difference, wherein an exposed surface area of the buffer layer is greater than an exposed surface area of the high-resistance buffer layer of the fourth through hole, and wherein one outer peripheral portion of the high-resistance buffer layer is contiguous with one outer peripheral portion of the window layer.

9. The method of claim 8, wherein the mask pattern is formed with an exposure hole corresponding to the third through hole.

10. The method of claim 9, wherein the mask pattern comprises:

a first mask part adjacent to the exposure hole and having a first thickness; and a second mask part surrounding the first mask part and having a second thickness thicker than the first thickness.

11. The method of claim 10, wherein the first mask part corresponds to the fourth through hole.

12. The method of claim 11, further comprising removing the first mask part and reducing the second thickness of the second mask part.

* * * * *